(12) United States Patent
Crawford et al.

(10) Patent No.: US 7,877,666 B2
(45) Date of Patent: Jan. 25, 2011

(54) TRACKING HEALTH OF INTEGRATED CIRCUIT STRUCTURES

(75) Inventors: John H. Crawford, Saratoga, CA (US); Tsvika Kurts, Haifa (IL); Moty Mehalel, Haifa (IL)

(73) Assignee: Intel Corporation, Santa Clara, CA (US)

( * ) Notice: Subject to any disclaimer, the term of this patent is extended or adjusted under 35 U.S.C. 154(b) by 1043 days.

(21) Appl. No.: 11/618,766

(22) Filed: Dec. 30, 2006

(65) Prior Publication Data

US 2008/0163014 A1 Jul. 3, 2008

(51) Int. Cl.
*G11C 29/00* (2006.01)

(52) U.S. Cl. .................................................. 714/763
(58) Field of Classification Search ............ 714/6, 714/763, 764, 770
See application file for complete search history.

(56) References Cited

U.S. PATENT DOCUMENTS

| | | | |
|---|---|---|---|
| 6,971,042 B2 * | 11/2005 | Anderson | 714/6 |
| 7,103,826 B2 * | 9/2006 | Thayer et al. | 714/763 |
| 7,178,088 B2 * | 2/2007 | Hashimoto et al. | 714/764 |
| 2006/0161831 A1 | 7/2006 | Mehalel | |

OTHER PUBLICATIONS

Kurtis, Tsvika, et al., "Method and Apparatus of Reporting Memory Bit Correction", Filed Dec. 29, 2005; U.S. Appl. No. 11/320,496.
Mitchell et al., IBM @ servr p5: A Highly Available Design for Business-Critical Applications, Dec. 15, 2004, 40 pages.
IA-32 Intel® Architecture Software Developer's Manual, vol. 3A: System Programming Guide, Part 1, Jun. 2006, 640 pages.

* cited by examiner

*Primary Examiner*—Shelly A Chase
(74) *Attorney, Agent, or Firm*—Caven & Aghevli LLC

(57) ABSTRACT

Methods and apparatus to track the health of integrated circuit structures are described. In an embodiment, a counter may be updated when the status of a portion of a storage unit (e.g., a cache) transitions to a defective status (e.g., as determined by reference to one or more corresponding status bits). The value stored in the counter may be compared with a threshold value, e.g., to generate a signal that is indicative of whether the threshold value has been exceeded. Other embodiments are also described.

33 Claims, 5 Drawing Sheets

TRACKING HEALTH OF INTEGRATED CIRCUIT STRUCTURES

BACKGROUND

The present disclosure generally relates to the field of electronics. More particularly, an embodiment of the invention relates to techniques for tracking health of integrated circuit structures, such as the health of a cache.

To improve performance, some computing systems may include a cache. The cache may store a copy of data, which is stored elsewhere or computed earlier, for faster access. For example, a cache may be used to store data for faster access by a processor. To improve reliability, some computing systems may utilize error correcting code to attempt to correct cache errors that occur during run-time. Some of the errors generated by a cache may, however, remain uncorrected. Also, since a processor may frequently access data stored in the cache to generate computational results, the overall system performance and reliability may be significantly reduced with an increase in the number of cache errors.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof. Also, the use of "instruction" or "micro-operation" (which may be referred to as "uop") herein may be interchangeable.

Some of the embodiments discussed herein may be utilized to track the health of integrated circuit (IC) structures, such as the health of a cache. In one embodiment, a counter may be updated when a portion of a storage unit (e.g., a cache) transitions to a defective status (e.g., as determined by reference to one or more corresponding status bits). The value stored in the counter may be compared with a threshold value, e.g., to generate a signal that is indicative of whether the threshold value has been exceeded. The threshold value may correspond to a specific design. For example, in implementations that utilize an error correction mechanism (such as error correcting code (ECC)) to correct the output of a storage unit (e.g., the output of a cache), the threshold value may correspond to the design capacity of the cache error correction mechanism. Such techniques may allow for improved performance and/or reliability in various computing systems, such as the computing systems discussed with reference to FIGS. 1 and 4-5.

Figure 1:
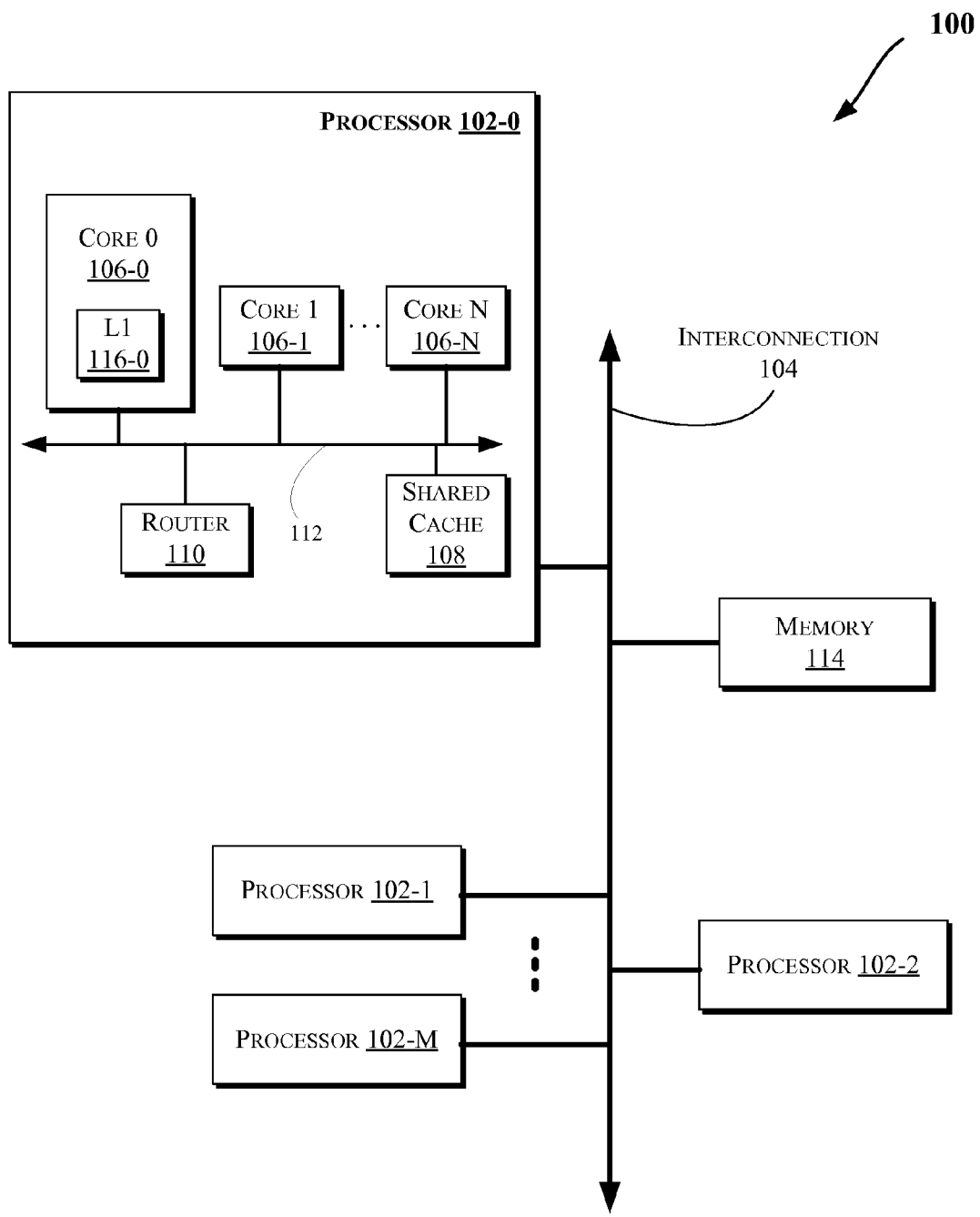
FIGS. 1, 2, 4, and 5 illustrate block diagrams of embodiments of computing systems, which may be utilized to implement various embodiments discussed herein.

More particularly, FIG. 1 illustrates a block diagram of a computing system 100, according to an embodiment of the invention. The system 100 may include one or more processors 102-0 through 102-M (collectively referred to herein as "processors 102" or more generally "processor 102"). The processors 102 may communicate via an interconnection network or bus 104. Each processor may include various components, some of which are only discussed with reference to processor 102-0 for clarity. Accordingly, each of the remaining processors 102-0 through 102-M may include the same or similar components discussed with reference to the processor 102-0.

In an embodiment, the processor 102-0 may include one or more processor cores 106-0 through 106-N (collectively referred to herein as "cores 106" or more generally "core 106"), a shared cache 108, and/or a router 110. The processor cores 106 may be implemented on a single integrated circuit (IC) chip. Moreover, the chip may include one or more shared and/or private caches (such as cache 108), buses or interconnections (such as a bus or interconnection network 112), memory controllers (such as those discussed with reference to FIGS. 4 and 5), or other components. Alternatively, shared and/or private caches (such as cache 108) may be provided on a separate chip than the cores 106.

In one embodiment, the router 110 may be used to communicate between various components of the processor 102-0 and/or system 100. Moreover, the processor 102-0 may include more than one router 110. Furthermore, the multitude of routers (110) may be in communication to enable data routing between various components inside or outside of the processor 102-0.

The shared cache 108 may store data (e.g., including instructions) that are utilized by one or more components of the processor 102-0, such as the cores 106. For example, the shared cache 108 may locally cache data stored in a memory 114 for faster access by components of the processor 102. In an embodiment, the cache 108 may include a mid-level cache (such as a level 2 (L2), a level 3 (L3), a level 4 (L4), or other levels of cache), a last level cache (LLC), and/or combinations thereof. Moreover, various components of the processor 102-0 may communicate with the shared cache 108 directly, through a bus (e.g., the bus 112), and/or a memory controller or hub. As shown in FIG. 1, in some embodiments, one or more of the cores 106 may include a level 1 (L1) cache (116-0) (collectively referred to herein as "cache 116") or other levels of cache such as L2.

Figure 2:
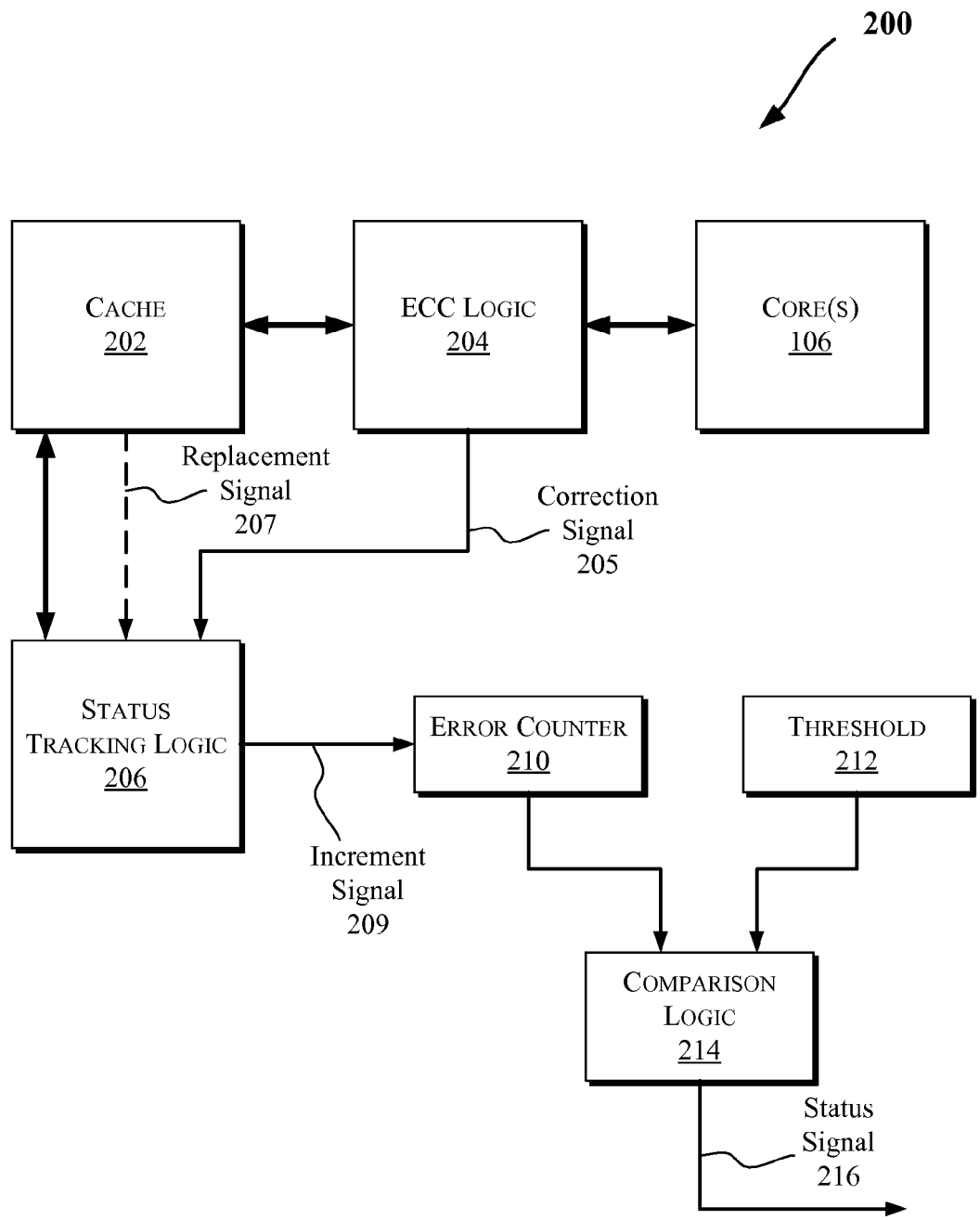

FIG. 2 illustrates a block diagram of portions of a computing system 200, according to an embodiment of the invention. In an embodiment, the direction of arrows in FIG. 2 indicates the flow of signals between the components of the system 200. In one embodiment, the components of the system 200 may be provided on a single IC chip or on multiple IC chips. In an embodiment, the components of the system 200 may be provided inside a processor (such as the processors 102 of FIG. 1).

As shown in FIG. 2, the system 200 may include the cores 106 and a cache 202. The cache 202 may be the same or similar to the caches 108 and/or 116 discussed with reference to FIG. 1. In an embodiment, the cache 202 may include one or more bit cells, which may be static random access memory (SRAM) bit cells or other types of memory cells such as those discussed with reference to FIGS. 4-5. Further, the cache 202 may be divided into one or more cache lines, cache blocks, or error correcting code (ECC) blocks. As discussed herein, a "cache portion" or a "portion" of a "cache" may refer to any portion of a cache such as a cache line, a cache block, an ECC block, or more generally any number of cache bit cells. Hence, these terms may be interchangeable herein. The cache 202 may include one or more bits per each cache portion to indicate the number of detected errors corresponding to that cache portion. Alternatively, the bit(s) that indicate the number of detected errors of each cache portion may be stored in a separate (associative) structure than the cache 202.

In an embodiment, the cache 202 may include one or more bits per each cache portion to indicate the status of the cache portion. For example, the status of each cache portion may include one or more of the following statuses: (1) a "clean" status where no errors have been detected (which may be the initial value for the cache status bits in an embodiment); (2) an "intermediate" status that may have several levels depending on the sophistication of the status tracking; and/or (3) a "defective" status which may be reached when a select pattern of corrections have occurred for the given portion of the cache. In one embodiment, the intermediate status may be optional and only options (1) and (3) discussed above may be implemented. Alternatively, the status of each cache portion may include one or more of the following statuses: (a) "initial state" which may indicate no errors; (b) "one correction" which may be established after the first error is detected; (c) "refresh" which may be established when the cache portion is overwritten, e.g., clearing any previous errors; and/or (d) "second/repeated correction" which may indicate a correction after the cache portion is refreshed. In some embodiments, the cache 202 may include one or more bits per each cache portion to indicate the status of the cache portion in accordance with any combination of options (1)-(3) and/or (a)-(d) discussed above. In an embodiment, two or more bits may be used per cache portion to track the intermediate states. In some embodiments, these status/state bits may be provided within the cache 202 (e.g., for each cache portion) or within a separate associative structure inside or outside of the cache 202.

The system 200 may also include an error correcting code (ECC) logic 204, e.g., to correct erroneous outputs of the cache 202 prior to providing the outputs to other components such as the cores 106. In one embodiment, the ECC logic 204 may utilize a number of check bits corresponding to each cache portion in the cache 202 by applying a specialized coding scheme that is able to detect and correct errors in the bits contained within the cache portion. For example, ECC logic 204 may provide single-error correction and double error detection (SECDED). With such code, single-bit errors may be corrected and double-bit errors detected (and distinguished from single-bit errors). Hence, a number of cell defects may be within the expected normal range of the system 200 when the ECC logic 204 is utilized.

As the ECC logic 204 detects an error and attempts to correct it, the logic 204 may generate a correction signal 205, e.g., to indicate that a correction to an output of the cache 202 has been attempted. The types of errors detected may be any type of an error that indicates a portion of the cache 202 may be defective, e.g., due to detected but uncorrected errors (DUEs), a neutron or alpha particle hit on the portion of cache 202, other ionizing events on the portion of cache 202, manufacturing defects, age-related conditions, etc. The signal 205 may be provided to a status tracking logic 206 which may perform various tasks to keep track of errors within a portion of the cache 202, such as updating one or more status bits corresponding to the cache portion. A portion of the cache 202 may be considered "defective" if there have been one or more instances of a correction to the bits within that portion. For example, when one or more bits within that portion of the cache have a hardware-related defect, e.g., due to manufacturing defect or lifetime wear-out condition, or an intermittent defect caused by a marginal manufacturing condition such as high leakage, or other intermittent conditions. In some embodiments, these types of errors may be distinguished from one-time soft errors, e.g., caused by radiation-particle-induced noise such as from a neutron or alpha particle hit to a cache cell, in part, because these hard or intermittent defects may cause multiple errors as that portion of the cache is accessed.

For example, the logic 206 may determine when a block or line of the cache 202 has incurred repeated corrections (e.g., with reference to the one or more bit(s) that indicate the number of detected errors of each cache portion or status of the given cache portion), and should be considered to contain a defective bit. In an embodiment, the line or block may be marked as "defective" on the first correction. This would minimize the state needed for the line/block status structure discussed above, and potentially simplify the implementation of the logic 206. This approach may also mark lines or blocks of the cache 202 that have incurred a correction due to a soft error as defective, e.g., caused by a neutron, alpha particle, or other ionizing event. In another embodiment, two corrections to a line or block of the cache 202 may be considered prior to marking the line or block as defective. In an embodiment, an intervening scrub or overwrite of the line or block may be performed per a replacement signal 207 (which may correspond to options (c) and/or (d) discussed above in an embodiment), e.g., in order to avoid flagging lines/blocks for transient soft-errors.

In some embodiments, the logic 206 may update one or more bit(s) discussed above that indicate the number of times an error has been detected for a portion of the cache 202. Furthermore, after the logic 206 determines that a portion of the cache 202 (e.g., a cache line or block) has transitioned from "good" to "defective" status, it may generate a signal 209 to cause an update (e.g., increment) to the value stored in an error counter 210. A register 212 may store a threshold value that is compared against the value stored in the counter 210 by a comparison logic 214. Alternatively, the threshold value (212) may be stored in read-only memory cell(s), by fuses, or embedded in the logic, or a combination of the above, etc. The logic 214 may generate a status signal 216 that indicates whether the value stored in the counter 210 has exceeded the threshold value (212). In one embodiment, the threshold value (212) may correspond to the design capacity of the cache error correction mechanism (e.g., ECC logic 204). Furthermore, in an embodiment, the cache 202 may be marked as "over the threshold" if the status signal 216 indicates that the number of portions that have been marked as "defective" within the cache 202 have exceeded the given threshold (212), and consequently may be operating in a cautionary/degraded status. Otherwise, if the count (210) is less than or equal to the threshold (212), the cache 202 status may be marked as normal. Alternatively, the comparison to the threshold value may indicate "degraded" status if the count is greater than or equal to the threshold, and normal if the count is less than the threshold.

In an embodiment, software (such as system management software executing on one of the cores 106 or another processor core off the system 200) may (e.g., periodically) monitor the threshold status of the cache 202 by referring to the status signal 216. Alternatively, a value corresponding to the assertion status of the signal 216 may be stored in a register that is accessible by software such as system management software. For example, a machine-check architecture (MCA) reporting mechanism for hardware may be used to communicate that certain MCA events have occurred. This may be provided by a group of registers to hold information on events from different structures within a chip. In an embodiment, each group of registers may be called a "bank" and may hold all of the status for the event posted by hardware. These MC banks may be the communication method between the hardware that is doing the checking and possibly correcting (e.g., logic 204); and the system management software that aims to examine the MCA events to monitor the operating status of the processor.

In some embodiments, the logic 206 may take one of several responses upon detecting a "defective" cache portion, such as:

(a) The cache portion may be disabled by removing it from service. This may be accomplished in a cache structure by flushing the contents of a modified cache portion to a higher level of the memory hierarchy, and then marking the cache portion as disabled, and not available for allocation. This may be referred to as a "cache line disable" strategy, or CLD;

(b) The cache portion may be repaired by providing a method for substituting a redundant, or spare, block for the bits in the "defective" line. This may be referred to as a "cache line repair" strategy; and/or (c) The cache portion may simply be left in place, with an ECC scheme that will repeatedly correct the single defective cell in the line or block. This may be referred to as a "Single Bit Fix" (SBF) strategy, since the single defective bit is repeatedly fixed by the ECC mechanism (e.g., logic 204). In an embodiment, the SBF may also provide for filtering out redundant postings of correction events to the same cache portion, e.g., only the first few corrections are actually posted. This approach may prevent the redundant postings from flooding the system event log.

In one embodiment, CLD may disable a cache line that has suffered repeated corrections. After the line is disabled, no more corrections to that line may be posted in the Machine Check (MC) banks. Moreover, SBF may leave defective bits in place, and rely on flow-through ECC (e.g., through logic 204) to repeatedly correct single-bit errors. In the SBF scheme, postings of corrections into the MC bank may be filtered such that only the first few corrections for a line are posted. This may ensure that the MC bank will not be flooded with redundant postings of multiple corrections to the same line. In both cases, it may be of interest to system management software to know if a line has reached a degraded status and has been disabled, or if future correction reports will be filtered.

Furthermore, the processor/system/platform response for a cautionary event (e.g., signal 216) may be less severe than for a detected but uncorrected error (DUE). A DUE may correspond to the realization of an error, whereas the cautionary status may be a warning that the structure associated with the event/error is operating with degraded availability (for SBF) or performance (CLD), but in itself is not an uncorrectable event. In an embodiment, the cautionary indicator may be provided to system management software as an early warning that a structure has degraded, and to consider scheduling the component containing the structure for field service and possible replacement at a future time. Alternatively, the system management may take the processor(s) and/or other system components affected by the degraded structure off-line gracefully, and let the overall system operate in a higher-level degraded mode using fewer processors, and/or to configure in spare processor(s) to replace those affected by the degraded structure, or some other appropriate response. In an embodiment, the cautionary status indicator may be provided as a warning that the structure has reached a degraded status (but still operating correctly), such that graceful recovery methods may be invoked in a routine manner before a more catastrophic system event occurs.

In an embodiment, in order to communicate the status of a structure (e.g., cache 202) on the chip, a 2-bit status field may be provided in the MC bank used to report events from that structure such as shown in Table 1 below.

TABLE 1

| Status [1:0] | Encoding | Meaning |
| --- | --- | --- |
| 00 | no tracking | No hardware status tracking is provided for the structure reporting this event |
| 01 | Normal | Status tracking is provided for the structure reporting this event; Current status is Normal, at or below the threshold. |
| 10 | Cautionary | Status tracking is provided for the structure reporting this event; Current status is Cautionary, or above the threshold. |
| 11 | Reserved | |

The "00" code may be used to report events for structures that do not have the status monitoring hardware described earlier, such as small arrays, or busses, or other platform structures such as dynamic random access memory (DRAM) dual inline memory modules (DIMMs) that are not provided with the status monitoring. In an embodiment, system management software may distinguish the unmonitored structures, because it may want to perform alternative status monitoring in software for these structures. Additionally, in order to support the inclusion of the structure status indicator in an upwards compatible way, a configuration indicator may be provided to inform software of the presence (or absence) of this mechanism. For example a bit may be set or cleared to indicate the presence or absence of the structure status indicator. This allows for new management software to work effectively on old hardware that does not support the status indicator, as well as new hardware that does provide this new capability.

In some embodiments, the structure status tracking mechanism discussed herein may provide a second type of corrected error event posting in the MC banks. Since these banks may also be used to post uncorrected error (UC) events, the priority of the events may be set to support the retention of the most important messages. This may be done by permitting higher priority events to overwrite lower priority events in the MC banks, but not allowing lower priority events to overwrite higher priority events. An event may overwrite a previously posted event of equal priority. The priority order of these events, from highest to lowest is: 1) UC events, 2) corrected events from a structure with Cautionary status, and 3) corrected events from a structure with normal or unmonitored status. This is shown in Table 2 below.

TABLE 2

| $1^{st}$ Error | $2^{nd}$ Error | MCA Info |
| --- | --- | --- |
| 00/Normal | 00/Normal | Either |
| Normal/00 | Cautionary | $2^{nd}$ error |
| Cautionary | 00/Normal | $1^{st}$ error |
| Cautionary | Cautionary | Either |
| 00/Normal/Cautionary | UC | $2^{nd}$ |

TABLE 2-continued

| 1st Error | 2nd Error | MCA Info |
|---|---|---|
| UC | 00/Normal/Cautionary | 1st |
| UC | UC | Either |

As mentioned above, both the CLD and SBF techniques may stop reporting corrections for lines that have been flagged as containing defective bits. These methods may report one or more corrections before event filtering starts. It may be of interest to system management software to distinguish the ordinary correction events from the "last" event to be reported before filtering or disabling occurs. This may be done by providing an indicator to distinguish the two cases. One method is to provide a bit posted in the MC bank to distinguish the two types of events. For example, a bit in the MC Status register may be modified to indicate that this posting will be the last report for corrected errors in that line/entry, at least for some time. See, e.g., Table 3 below. A 0 in bit 12 indicates a "normal" corrected error, and a 1 would indicate that error filtering is activated for the line/entry in the posting. Moreover, chips that use a strategy to SBF/CLD a line on the 1st correction may report using the filtering error codes, to indicate that the SBF/CLD actions are taken on the first correction. Chips that use a strategy to SBF/CLD a line after the 2nd correction may use the normal code (bit 12=0) for the 1st correction, and the filtering error code (bit 12=1) for the second posting.

TABLE 3

| Error Code | Binary Encoding/Form | Meaning |
|---|---|---|
| No Error | 0000 0000 0000 0000 | No error has been reported to this bank of error-reporting registers. |
| Unclassified | 0000 0000 0000 0001 | This error has not been classified into the MCA error classes. |
| Microcode ROM Parity Error | 0000 0000 0000 0010 | Parity error in internal microcode ROM. |
| External Error | 0000 0000 0000 0011 | An error signal from another processor caused this processor to enter machine check.[1] |
| FRC Error | 0000 0000 0000 0100 | FRC (functional redundancy check) master/slave error |
| Generic Memory Hierarchy | 000F 0000 0000 11LL | Generic memory hierarchy error |
| TLB (translation lookaside buffer) Errors | 000F 0000 0001 TTLL | TT TLB LL error |
| Memory Hierarchy Errors | 000F 0001 RRRR TTLL | TT Cache LL RRRR Error |
| Internal Timer | 0000 0100 0000 0000 | |
| Internal Unclassified | 0000 01xx xxxx xxxx | Internal unclassified errors[2] |
| Bus and Interconnect Errors | 000F 1PPT RRRR IILL | |

In Table 3, bit 12 denotes an "F" field that is encoded as shown in Table 4 below.

TABLE 4

| F | Meaning |
|---|---|
| 0 | Normal Correction posting, subsequent corrections will be posted. |
| 1 | Corrected Error Filtering action: Some or all of the subsequent corrections to this entry (in this structure) will not be posted. (Uncorrected events are always posted, however) |

Figure 3:
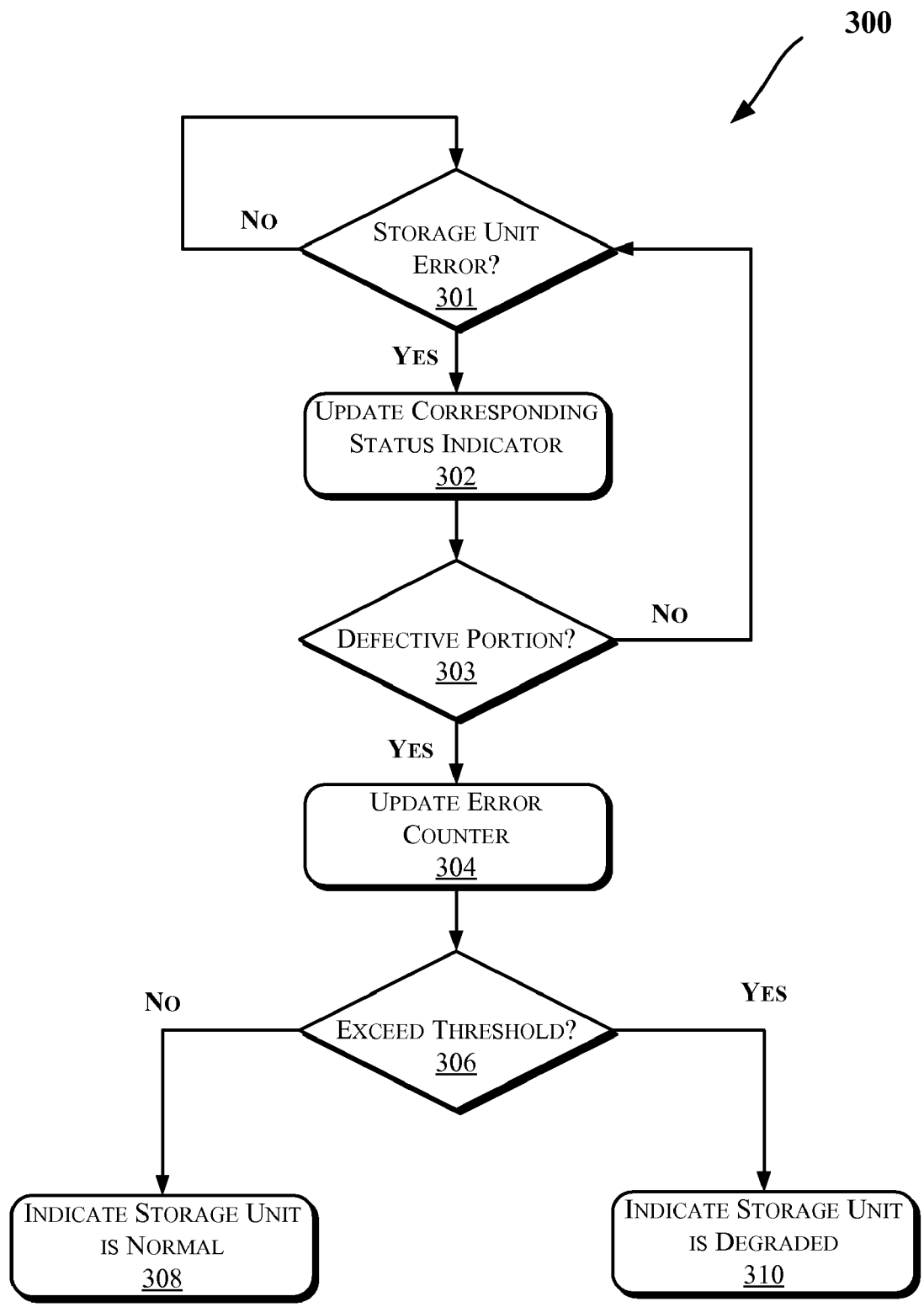
FIG. 3 illustrates a flow diagram of a method in accordance with an embodiment of the invention.

FIG. 3 illustrates a flow diagram of a method 300 to track the health of an on-chip structure, according to an embodiment of the invention. In some embodiments, various components discussed with reference to FIGS. 1-2 and 4-5 may be utilized to perform one or more of the operations discussed with reference to FIG. 3. For example, the method 300 may be used to track the health of the cache 202 of FIG. 2.

Referring to FIGS. 1-3 at an operation 301, it is determined whether an error in a storage unit has occurred (e.g., the ECC logic 204 may determine whether an error has occurred with respect to an output of the cache 202, and furthermore the ECC logic may correct the error, or may report it as an uncorrected error). At an operation 302, the status of the corresponding portion of the storage unit may be updated in response to error occurrence at operation 301 (e.g., the status tracking logic 206 may update one or more bits that correspond to the cache portion generating the error). At an operation 303, it may be determined whether the updating at operation 302 has transitioned the portion of the storage unit to a "defective" status (e.g., as discussed with reference to FIG. 2 in connection with the one or more status bits corresponding to the cache portion). At an operation 304, an error counter may be updated (e.g., the logic 206 may cause the updating of the counter 210). At an operation 306, it may be determined whether the counter value (e.g., value stored in the counter 210) has exceeded a threshold value (e.g., the threshold value 212). If the threshold value is not exceeded, then the storage unit may be indicated as normal (e.g., by the signal 216) at an operation 308. Otherwise, once the threshold is exceeded, the storage unit may be indicated as degraded at an operation 310 (e.g., as discussed with reference to the status of cache 202 of FIG. 2).

In some embodiments, system management software may be provided with a mechanism (e.g., through one or more components discussed with reference to system 200 of FIG. 2) to monitor the status of select structures present on an IC chip. Such embodiments may be distinguishable from software-only solutions because software is not guaranteed to see all of the events posted to MC banks, e.g., since several events may happen between the polling intervals done by software monitoring the MC banks, events may not be communicated or detected, leading to an incomplete picture of the series of events as seen by the software.

Also, the applicability of the techniques discussed herein is not limited to a cache structure. More generally, some of the techniques may report the status (e.g., normal vs. cautionary/degraded) of any structure within an IC chip. For example, logic may be provided to monitor/assess the health of a structure on a chip, and some signal may be generated to communicate this status to other entities. In one instance, a memory controller may be monitored by some logic to assess the controller's health, and the logic may report a degraded status in some instances. The logic may further cause reconfiguration of the memory controller to a degraded performance/availability mode.

Figure 4:
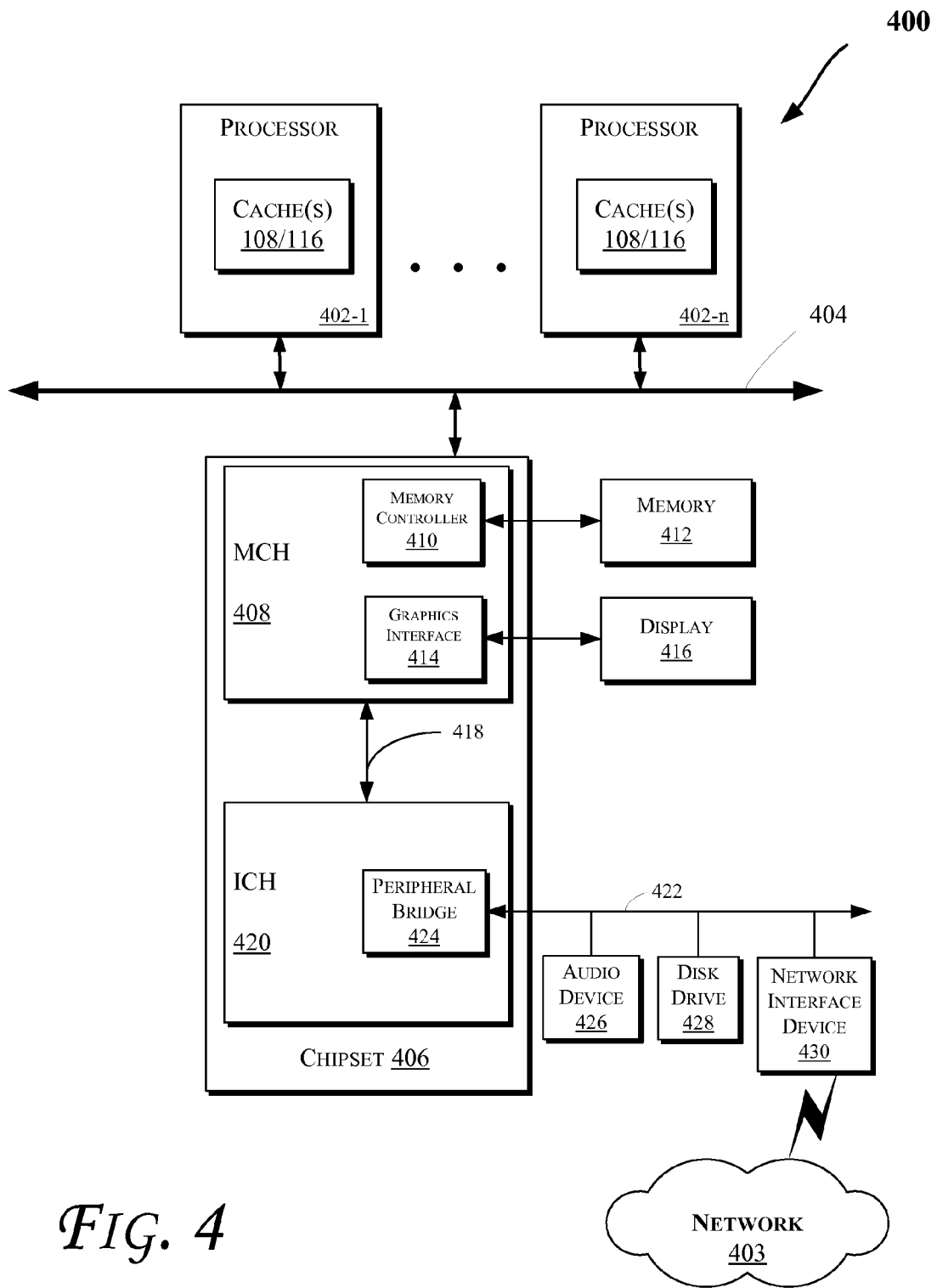

FIG. 4 illustrates a block diagram of a computing system 400 in accordance with an embodiment of the invention. The computing system 400 may include one or more central processing unit(s) (CPUs) 402 or processors that communicate via an interconnection network (or bus) 404. The processors 402 may include a general purpose processor, a network processor (that processes data communicated over a computer network 403), or other types of a processor (including a reduced instruction set computer (RISC) processor or a complex instruction set computer (CISC)). Moreover, the processors 402 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors. In an embodiment, one or more of the processors 402 may be the same or similar to the processors 102 of FIG. 1. For example, one or more of the processors 402 may include one or more of the cores 106 and/or caches 108/116. Also, the operations discussed with reference to FIGS. 1-3 may be performed by one or more components of the system 400.

A chipset 406 may also communicate with the interconnection network 404. The chipset 406 may include a memory control hub (MCH) 408. The MCH 408 may include a memory controller 410 that communicates with a memory 412 (which may be the same or similar to the memory 114 of FIG. 1). The memory 412 may store data, including sequences of instructions, that may be executed by the CPU 402, or any other device included in the computing system 400. In one embodiment of the invention, the memory 412 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 404, such as multiple CPUs and/or multiple system memories.

The MCH 408 may also include a graphics interface 414 that communicates with a display device 416. In one embodiment of the invention, the graphics interface 414 may communicate with the display device 416 via an accelerated graphics port (AGP). In an embodiment of the invention, the display 416 (such as a flat panel display) may communicate with the graphics interface 414 through, for example, a signal converter that translates a digital representation of an image stored in a storage device such as video memory or system memory into display signals that are interpreted and displayed by the display 416. The display signals produced by the display device may pass through various control devices before being interpreted by and subsequently displayed on the display 416.

A hub interface 418 may allow the MCH 408 and an input/output control hub (ICH) 420 to communicate. The ICH 420 may provide an interface to I/O device(s) that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 420, e.g., through multiple bridges or controllers. Moreover, other peripherals in communication with the ICH 420 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403). Other devices may communicate via the bus 422. Also, various components (such as the network interface device 430) may communicate with the MCH 408 in some embodiments of the invention. In addition, the processor 402 and the MCH 408 may be combined to form a single chip. Furthermore, a graphics accelerator may be included within the MCH 408 in other embodiments of the invention.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 5:
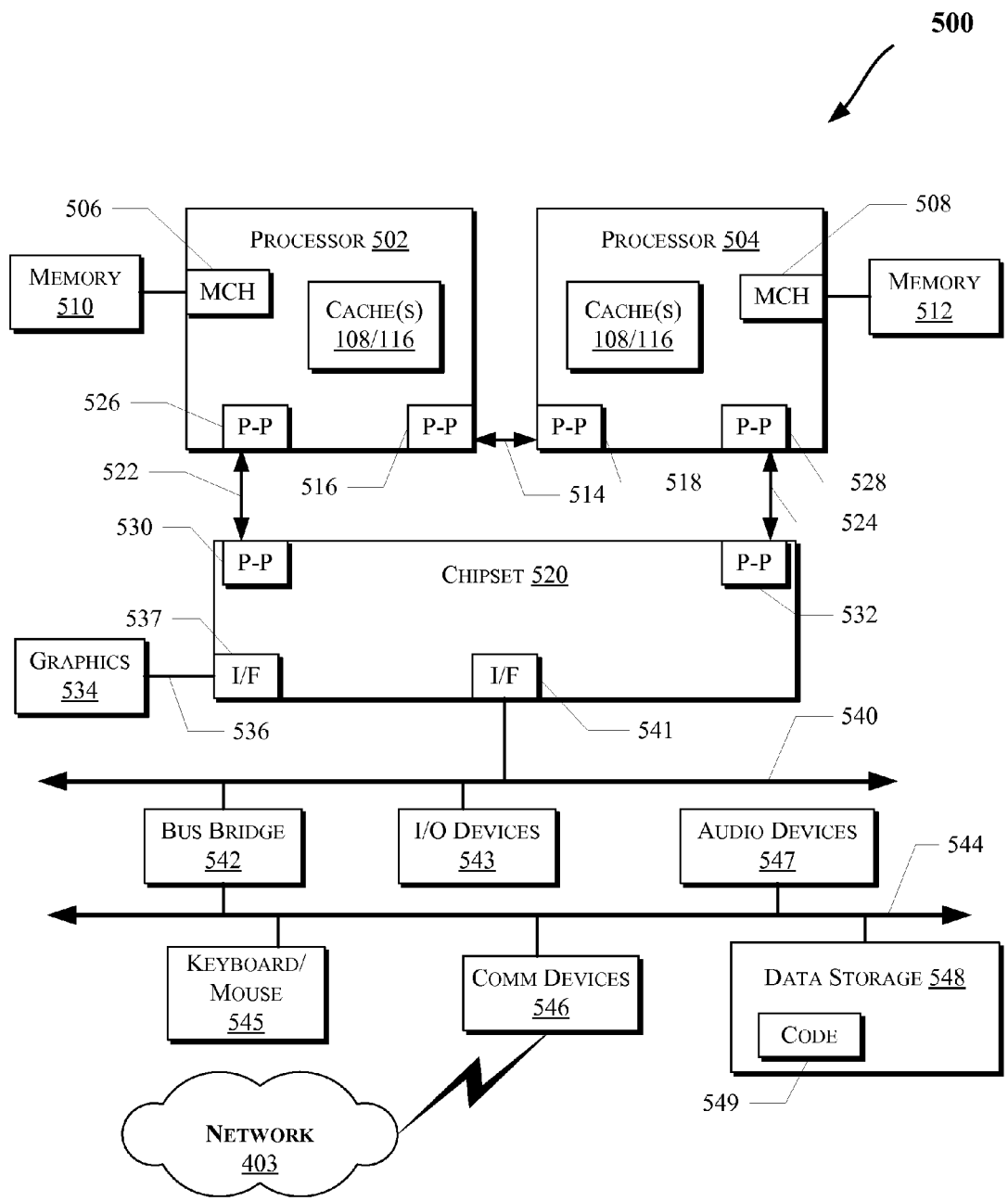

FIG. 5 illustrates a computing system 500 that is arranged in a point-to-point (PtP) configuration, according to an embodiment of the invention. In particular, FIG. 5 shows a system where processors, memory, and input/output devices are interconnected by a number of point-to-point interfaces. The operations discussed with reference to FIGS. 1-4 may be performed by one or more components of the system 500.

As illustrated in FIG. 5, the system 500 may include several processors, of which only two, processors 502 and 504 are shown for clarity. The processors 502 and 504 may each include a local memory controller hub (MCH) 506 and 508 to enable communication with memories 510 and 512. The memories 510 and/or 512 may store various data such as those discussed with reference to the memory 412 of FIG. 4.

In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Also, the processors 502 and 504 may each exchange data with a chipset 520 via individual PtP interfaces 522 and 524 using point-to-point interface circuits 526, 528, 530, and 532. The chipset 520 may further exchange data with a graphics circuit 534 via a graphics interface 536, e.g., using a PtP interface circuit 537.

At least one embodiment of the invention may be provided within the processors 502 and 504. Other embodiments of the invention, however, may exist in other circuits, logic units, or devices within the system 500 of FIG. 5. Furthermore, other embodiments of the invention may be distributed throughout several circuits, logic units, or devices illustrated in FIG. 5.

The chipset 520 may communicate with a bus 540 using a PtP interface circuit 541. The bus 540 may communicate with one or more devices, such as a bus bridge 542 and I/O devices 543. Via a bus 544, the bus bridge 542 may communicate with other devices such as a keyboard/mouse 545, communication devices 546 (such as modems, network interface devices, or other communication devices that may communicate with the computer network 403), audio I/O device 547, and/or a data storage device 548. The data storage device 548 may store code 549 that may be executed by the processors 502 and/or 504.

In various embodiments of the invention, the operations discussed herein, e.g., with reference to FIGS. 1-5, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed with respect to FIGS. 1-5.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Reference in the specification to "one embodiment," "an embodiment," or "some embodiments" means that a particular feature, structure, or characteristic described in connection with the embodiment(s) may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
   a storage unit to store data;
   a first logic to cause a counter to be updated in response to a detection that a status of a portion of the storage unit has transitioned to a defective status; and
   a second logic to compare a value stored in the counter to a threshold value, wherein the storage unit is to comprise one or more status bits to indicate the status of the portion of the storage unit.

2. The apparatus of claim 1, wherein the storage unit is to comprise one or more bits to indicate a number of detected errors corresponding to the portion of the storage unit.

3. The apparatus of claim 1, wherein the second logic is to cause generation of a signal to indicate whether the value stored in the counter has exceeded the threshold value.

4. The apparatus of claim 1, wherein the first logic causes the counter to be incremented in response to the detection that the status of the portion of the storage unit has transitioned to the defective status.

5. The apparatus of claim 1, wherein the portion of the storage unit is to comprise one or more bit cells.

6. The apparatus of claim 1, wherein the storage unit is to comprise one or more of a static random access memory device or a dynamic random access memory device.

7. The apparatus of claim 1, wherein the portion of the storage unit is to comprise one or more cache lines, cache blocks, or error correcting code blocks.

8. The apparatus of claim 1, further comprising an error correcting code logic to correct an erroneous output of the storage unit.

9. The apparatus of claim 1, wherein one or more of the memory unit, the first logic, the second logic, or a plurality of processor cores are on a same integrated circuit chip.

10. An apparatus comprising:
    a cache that comprises a storage unit to store data;
    a first logic to cause a counter to be updated in response to a detection that a status of a portion of the storage unit has transitioned to a defective status; and
    a second logic to compare a value stored in the counter to a threshold value.

11. The apparatus of claim 10, wherein the cache is to comprise one or more of a private cache or a shared cache.

12. The apparatus of claim 10, wherein the cache is to comprise one or more of a level 1 cache, a mid-level cache, or a last level cache.

13. A method comprising:
    updating a counter in response to a detection that a portion of a storage unit has transitioned to a defective status;
    comparing a value stored in the counter against a threshold value; and
    generating a signal to indicate that the storage unit has a degraded status if the value stored in the counter exceeds the threshold value.

14. The method of claim 13, further comprising generating a signal to indicate that the storage unit has a normal status if the value stored in the counter is less than or equal to the threshold value.

15. The method of claim 13, further comprising correcting an erroneous output of the storage unit.

16. The method of claim 13, further comprising detecting an occurrence of an error by the portion of the storage unit.

17. The method of claim 13, further comprising updating a status of the portion of the storage unit in response to an occurrence of an error generated by the portion of the storage unit.

18. The method of claim 13, further comprising indicating whether the portion of the storage unit has previously generated an error.

19. A computing system comprising:
    a memory to store data; and
    a processor to comprise:
        a cache to locally store the data;
        a first logic to cause a counter to be updated in response to a detection that a status of a portion of the cache has transitioned to a defective status; and
        a second logic to cause generation of a signal to indicate whether a value stored in the counter has exceeded a threshold value, wherein the cache is to comprise one or more of a level 1 cache, a mid-level cache, or a last level cache.

20. The system of claim 19, wherein the second logic is to compare the value stored in the counter to the threshold value.

21. The system of claim 19, wherein the cache is to comprise one or more bits to indicate a number of detected errors corresponding to the portion of the cache.

22. The system of claim 19, wherein the first logic causes the counter to be incremented in response to the detection that the status of the portion of the cache has transitioned to the defective status.

23. The system of claim 19, wherein the portion of the cache is to comprise one or more bit cells.

24. The system of claim 19, wherein the cache is to comprise one or more status bits to indicate the status of the portion of the storage unit.

25. The system of claim 19, wherein the portion of the cache is to comprise one or more cache lines, cache blocks, or error correcting code blocks.

26. The system of claim 19, further comprising an error correcting code logic to correct an erroneous output of the cache.

27. The system of claim 19, further comprising an audio device coupled to the processor.

28. A method comprising:
   updating a counter in response to a detection that a portion of a storage unit has transitioned to a defective status;
   comparing a value stored in the counter against a threshold value; and
   indicating whether the portion of the storage unit has previously generated an error.

29. The method of claim 28, further comprising generating a signal to indicate that the storage unit has a normal status if the value stored in the counter is less than or equal to the threshold value.

30. The method of claim 28, further comprising generating a signal to indicate that the storage unit has a degraded status if the value stored in the counter exceeds the threshold value.

31. The method of claim 28, further comprising correcting an erroneous output of the storage unit.

32. The method of claim 28, further comprising detecting an occurrence of an error by the portion of the storage unit.

33. The method of claim 28, further comprising updating a status of the portion of the storage unit in response to an occurrence of an error generated by the portion of the storage unit.

* * * * *